(12) United States Patent
Choi et al.

(10) Patent No.: US 10,937,769 B2
(45) Date of Patent: Mar. 2, 2021

(54) IN-VEHICLE DISPLAY DEVICE USING SEMICONDUCTOR LIGHT-EMITTING DEVICE

(71) Applicant: ZKW Group GmbH, Wieselburg (AT)

(72) Inventors: Jinhyeok Choi, Seoul (KR); Heonsuk Oh, Seoul (KR); Yeonji Lee, Seoul (KR)

(73) Assignee: ZKW Group GmbH, Wieselburg (AT)

( * ) Notice: Subject to any disclaimer, the term of this patent is extended or adjusted under 35 U.S.C. 154(b) by 290 days.

(21) Appl. No.: 16/213,397

(22) Filed: Dec. 7, 2018

(65) Prior Publication Data

US 2019/0181124 A1   Jun. 13, 2019

Related U.S. Application Data

(63) Continuation of application No. PCT/KR2018/012462, filed on Oct. 22, 2018.

(60) Provisional application No. 62/596,102, filed on Dec. 7, 2017.

(51) Int. Cl.

| H01L 25/075 | (2006.01) |
|---|---|
| H01L 33/58 | (2010.01) |
| H01L 23/538 | (2006.01) |
| H01L 33/62 | (2010.01) |
| B60R 11/02 | (2006.01) |

(52) U.S. Cl.
CPC ...... *H01L 25/0753* (2013.01); *H01L 23/5387* (2013.01); *H01L 33/58* (2013.01); *H01L 33/62* (2013.01); *B60R 11/0229* (2013.01)

(58) Field of Classification Search
CPC ... H01L 25/075; H01L 25/0753; H01L 33/33; H01L 33/58; H01L 33/63; G02F 1/13; G02F 1/133; G02F 1/13306; G06F 1/637
USPC ........ 361/749–750, 760–761, 782–784, 795, 361/803; 174/250–258; 349/149–152
See application file for complete search history.

(56) References Cited

U.S. PATENT DOCUMENTS

| 6,169,708 B1* | 1/2001 | Kaneko ............. G02F 1/133536 349/115 |
|---|---|---|
| 2006/0022910 A1* | 2/2006 | Sekiya ................. G06F 1/1656 345/76 |
| 2009/0108753 A1* | 4/2009 | Matsubara ........... H05K 9/0054 313/582 |

(Continued)

FOREIGN PATENT DOCUMENTS

| KR | 1020050060821 | 6/2005 |
|---|---|---|
| KR | 1020080052903 | 6/2008 |

(Continued)

*Primary Examiner* — Tuan T Dinh
(74) *Attorney, Agent, or Firm* — Fish & Richardson P.C.

(57) ABSTRACT

The present invention provides a display device, including a display unit having a plurality of semiconductor light emitting devices and outputting light to an upper surface thereof, a transparent substrate located on an upper side of the display unit and having a fixing portion protruding from one surface thereof to surround a side surface of the display unit, an elastic portion located to cover a lower surface of the display unit and made of an elastic member, a first back cover coupled to a part of the transparent substrate not overlapping the display unit in an injection manner, and a second back cover located to overlap the display unit and fixed to the first back cover, wherein the elastic portion presses the display unit toward the transparent substrate.

15 Claims, 6 Drawing Sheets

(56) References Cited

U.S. PATENT DOCUMENTS

| | | | |
|---|---|---|---|
| 2009/0117944 A1* | 5/2009 | Lee | H04M 1/0266 455/566 |
| 2010/0167031 A1* | 7/2010 | Leu | B32B 27/286 428/212 |
| 2011/0127078 A1* | 6/2011 | Kanemitsu | G06F 3/0446 174/260 |

FOREIGN PATENT DOCUMENTS

| | | |
|---|---|---|
| KR | 100864407 | 10/2008 |
| KR | 1020120077572 | 7/2012 |
| KR | 101301521 | 8/2013 |
| KR | 1020140002491 | 1/2014 |
| KR | 1020150019204 | 2/2015 |
| KR | 1020160064489 | 6/2016 |
| KR | 1020160074771 | 6/2016 |
| KR | 101780902 | 9/2017 |

* cited by examiner

IN-VEHICLE DISPLAY DEVICE USING SEMICONDUCTOR LIGHT-EMITTING DEVICE

CROSS-REFERENCE TO RELATED APPLICATIONS

This application is a continuation of International Patent Application No. PCT/KR2018/012462, filed on Oct. 22, 2018, which claims the benefit of an earlier filing date and priority to U.S. Provisional Application No. 62/596,102, filed on Dec. 7, 2017, the contents of which are hereby incorporated by reference in their entirety.

TECHNICAL FIELD

The present invention relates to an in-vehicle display device, and more particularly, a display device using a semiconductor light emitting device.

BACKGROUND ART

Various components for vehicle control may be arranged inside the vehicle. For example, a button for controlling a side window of the vehicle, a button for controlling opening and closing of a vehicle door, and the like may be disposed inside the vehicle. The components may be disposed on a frame formed inside the vehicle.

The frame formed inside the vehicle is mainly made of a plastic material to reduce a weight of the vehicle. The plastic material is manufactured into a specific shape by injection molding and assembled inside the vehicle. During plastic injection, a raw material is exposed to high temperature, and thereby heat-sensitive components should not be injected together with plastic.

On the other hand, as functions of the vehicle become more diverse, the number of components arranged in the vehicle is increasing. Specifically, a plurality of display devices for controlling the vehicle and providing various information may be located in the vehicle.

However, since an inner space of the vehicle has a limited size, the arrangement of those display devices is limited. Attempts have been made to place displays in the existing frame inside the vehicle to efficiently utilize the inner space of the vehicle.

In order to mount a display inside the plastic frame, a method of injecting the plastic frame together with the display or a method of injecting the plastic frame and assembling the display inside the frame may be utilized. Among the above two methods, if the display is assembled inside the plastic frame, there is a problem that the display is not fixed properly inside the frame or the display is broken during assembly.

DETAILED DESCRIPTION OF THE DISCLOSURE

An aspect of the present invention is to provide a structure for preventing a separation of a display and breakage of the display during assembly, in assembling the display inside a plastic frame.

To achieve the aspect and other advantages of the present invention, there is provided a display device, including a display unit having a plurality of semiconductor light emitting devices and outputting light to an upper surface thereof, a transparent substrate located on an upper side of the display unit and having a fixing portion protruding from one surface thereof to surround a side surface of the display unit, an elastic portion located to cover a lower surface of the display unit and made of an elastic member, a first back cover coupled to a part of the transparent substrate not overlapping the display unit in an injection manner, and a second back cover located to overlap the display unit and fixed to the first back cover, wherein the elastic portion presses the display unit toward the transparent substrate.

In one embodiment, the display device may further include a filter layer located on another surface of the transparent substrate and having a semi-transmissive region for transmitting a part of incident light therethrough, and a non-transmissive region made of an opaque material, and the display unit may be located to overlap the semi-transmissive region of the filter layer.

In one embodiment, the fixing portion may be formed on an edge of the semi-transmissive region so that the display unit overlaps the semi-transmissive region.

In one embodiment, the second back cover may be located to press the elastic portion.

In one embodiment, a height of the fixing portion may be greater than a thickness of the display unit.

In one embodiment, a part of the elastic portion may be surrounded by the fixing portion.

In one embodiment, a part of the elastic portion may be located between the fixing portion and the second back cover, and a part of the elastic portion may press the fixing portion.

In one embodiment, the fixing portion may be provided with a concave-convex structure located on one surface thereof pressed by the elastic portion.

In one embodiment, the second back cover may be provided with a second fixing portion protruding to surround a side surface of the elastic portion.

In one embodiment, the second fixing portion may be located to be in contact with the transparent substrate.

In one embodiment, the display device may further include a circuit board located on one surface of the transparent substrate to apply a voltage to the display unit, and a connection electrode electrically connecting the circuit board and the display unit to each other, and a part of the connection electrode may be located on the fixing portion.

In one embodiment, the first back cover may be coupled to another region, except for a region connected to the connection electrode, of an entire region of the circuit board, in an injection manner.

In one embodiment, the second back cover may be located to overlap the region connected to the connection electrode of the entire region of the circuit board.

In one embodiment, the display device may further include a first adhesive layer located between the transparent substrate and the display unit to adhere the transparent substrate and the display unit to each other.

In one embodiment, the display device may further include a second adhesive layer located between the display unit and the elastic portion to adhere the display unit and the elastic portion to each other, and the second adhesive layer may have adhesive strength stronger than that of the first adhesive layer.

Effects of the Disclosure

According to the present invention, it is possible to prevent a display unit from being damaged during assembly of a back cover because an elastic portion prevents excessive pressure from being applied to the display unit while assembling the back cover.

In addition, according to the present invention, it is possible to prevent the display unit from being separated from a designated position due to external pressure while assembling the back cover.

BEST MODE FOR CARRYING OUT PREFERRED EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present invention is not limited by the accompanying drawings.

It will be understood that when an element such as a layer, area or substrate is referred to as being "on" another element, it can be directly on the element, or one or more intervening elements may also be present.

The present invention provides a structure for preventing breakage of a display device which may occur while a plastic frame and the display device are injected together. Hereinafter, embodiments of the present invention will be described in detail with reference to the accompanying drawings.

Figure 1:
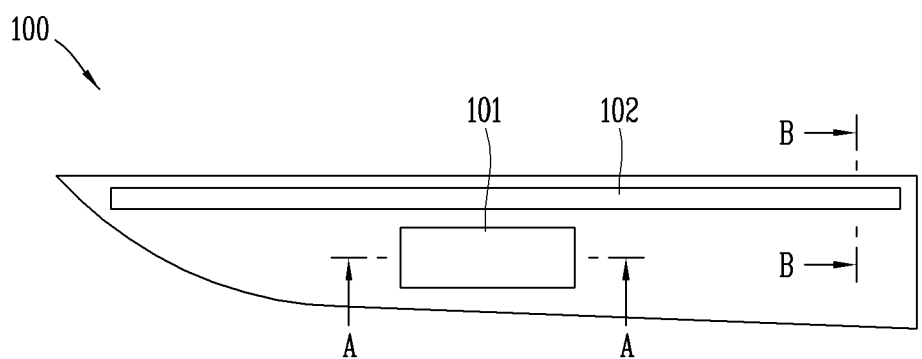
FIG. 1 is a conceptual view of an in-vehicle display device according to the present invention.
Figure 2:
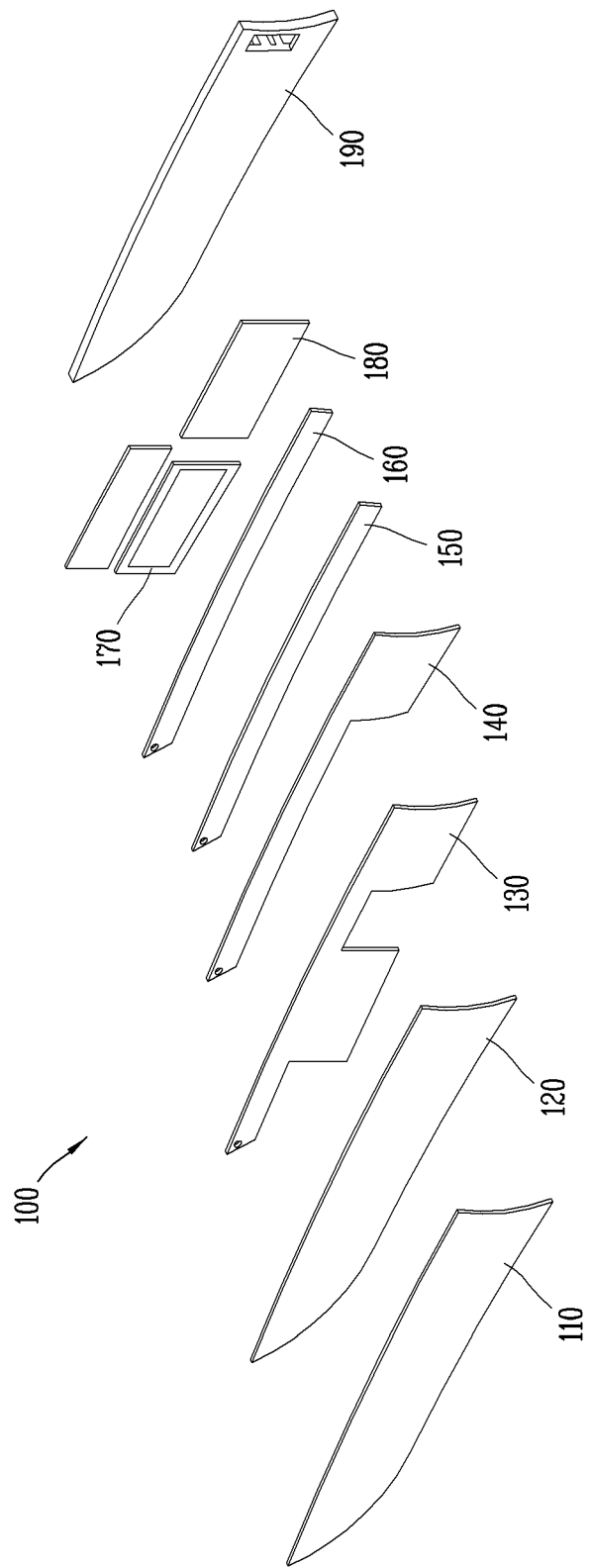
FIG. 2 is an exploded perspective view of a display device according to the present invention.

FIG. 1 is a conceptual view of an in-vehicle display device according to the present invention, and FIG. 2 is an exploded perspective view of a display device according to the present invention.

As illustrated in FIG. 1, a display device according to the present invention includes an area 101 in which screen information is displayed by a display unit and an area 102 in which light is emitted by a light source.

As illustrated in FIG. 2, the display device according to the present invention may include a filter layer 110, a transparent substrate 120, an adhesive layer 130, a circuit board 140, a diffuser 150, a reflective sheet 160, a display unit 170, a protective layer 180, and back cover 190.

However, the display device according to the present invention may include more or fewer components than the above-described components. Hereinafter, the aforementioned components will be described in detail.

The filter layer 110 allows a part of incident light to be transmitted therethrough. Transmittance may vary depending on a material forming the filter layer 110. In one embodiment, the filter layer 110 may be made of a mixture of polycarbonate (PC) and polymethyl methacrylate (PMMA).

On the other hand, only a part of the filter layer 110 may be semi-transmissive. Specifically, the filter layer 110 may have a semi-transmissive region which overlaps the display unit 170, which will be described later, and the remaining region may be a region through which light is not transmitted (hereinafter, referred to as a non-transmissive region). When the display unit is turned off, the semi-transmissive region may be viewed the same as the non-transmissive region. When the display unit 170 is turned on, part of light output from the display unit 170 is emitted to the outside.

The filter layer 110 is located on one surface of the transparent substrate 120. The transparent substrate 120 may be formed of a material having very high light transmittance. In one embodiment, the transparent substrate 120 may be made of PC.

Since the transparent substrate 120 is not injected together with the display unit 170 to be explained later, the adhesive layer 130 may be located between the transparent substrate 120 and the display unit 170. The adhesive layer 130 is located to overlap the display unit 170. The adhesive layer 130 is located between the circuit board 140 to be explained later and the transparent substrate 120.

A material forming the adhesive layer 130 should be a light-transmissive material that does not absorb light as much as possible.

The adhesive layer 130 adheres the circuit board 140 and the display unit 170 to the transparent substrate 120. The circuit board 140 is a printed circuit board for controlling the display unit 170. The circuit board 140 may be located on the same plane as the display unit 170 or on a different plane from the display unit 170.

On the other hand, a light source (220 of FIG. 4) different from the display unit 170 may be located on the circuit board 140. The light source 220 is utilized as a component for supplying light to the inside of the vehicle. The light source is not an essential configuration for the display device according to the present invention.

When the light source is included in the display device according to the present invention, a diffuser 150 may be provided on the circuit board 140 to guide light emitted from the light source. The diffuser 150 totally reflects light emitted from the light source to be discharged in a desired direction. In one embodiment, the diffuser 150 may be made of PC.

Light not totally reflected by the diffuser 150 is lost. To reduce the loss, a reflective sheet 160 may be located on a surface of the diffuser 150. The reflective sheet 160 reflects light which has not been totally reflected by the diffuser 150, such that the light is discharged to outside. In one embodiment, the reflective sheet 160 may be made of polyethylene terephthalate (PET).

The display unit 170 may be provided with a plurality of semiconductor light emitting devices. Each of the plurality of semiconductor light emitting devices forms a unit pixel of the display unit 170. The display unit 170 is assembled inside the plastic frame. At this time, the display unit 170 may not be located at a designated position, or may be damaged due to pressure applied during assembly. Specifically, the display device according to the present invention may be assembled in a manner of placing the display unit 170 at a designated position of the transparent substrate 120 and then covering the back cover 190. In this process, the display unit 170 may be separated (moved away, displaced) from the designated position or may be damaged by pressure applied from the back cover 190.

Meanwhile, a part of the back cover 190 is formed by being injected together with the transparent substrate 120, and the remaining part is separately manufactured and assembled. All the components of the display device according to the present invention are located on one surface of the back cover 190. The present invention is to prevent the display unit 170 from being changed in position or damaged when the back cover 190 is assembled on the display unit 170 placed on the transparent substrate 120.

Hereinafter, each component included in the display device according to the present invention will be described in more detail.

Figure 3:
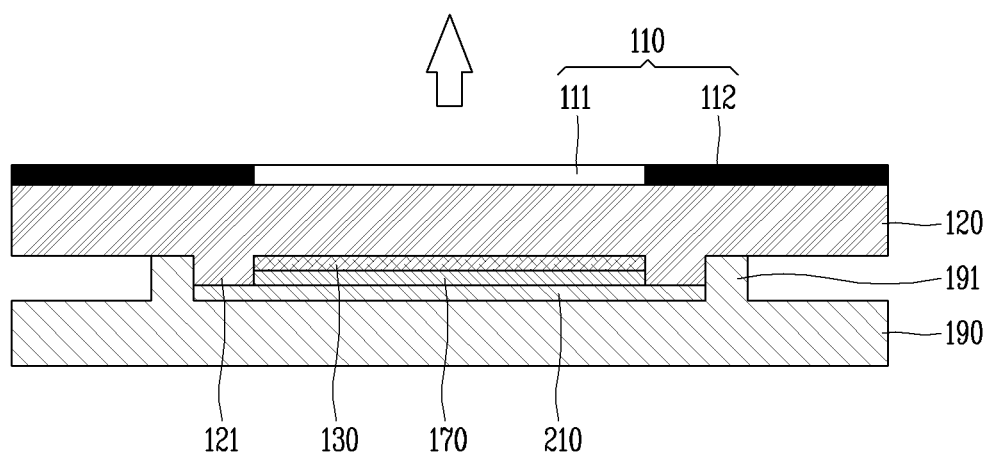
FIG. 3 is a sectional view taken along the line A-A of FIG. 1.
Figure 4:
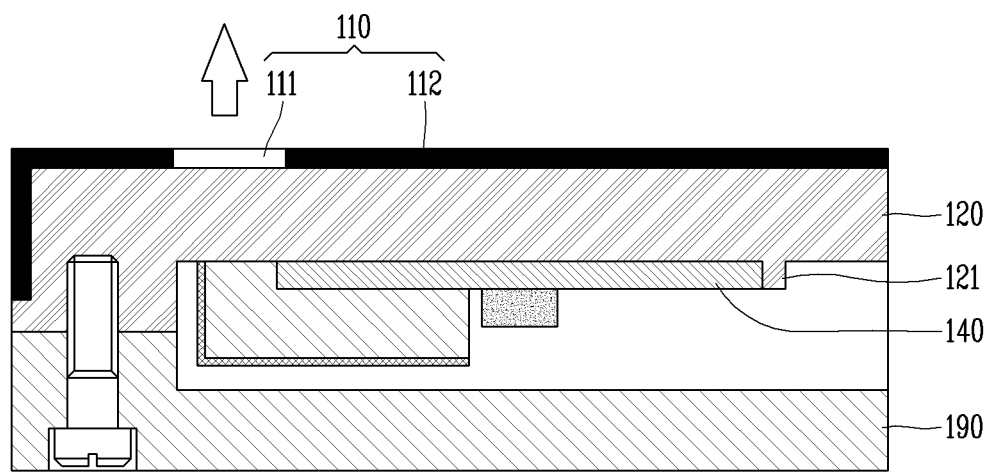
FIG. 4 is a sectional view taken along the line B-B of FIG. 1.

FIG. 3 is a sectional view taken along the line A-A of FIG. 1, and FIG. 4 is a sectional view taken along the line B-B of FIG. 1.

The transparent substrate 120 includes a fixing portion 121 located on an upper side of the display unit 170 and protruding from one surface of the transparent substrate 120 so as to surround a side surface of the display unit 170. On the other hand, an elastic portion 210 is located on a lower surface of the display unit 170.

Specifically, the fixing portion 121 prevents the display unit 170 from being separated from the designated position. Since the display unit 170 must maintain an overlapped state with the semi-transmissive region of the filter layer 110, the fixing portion 121 must be formed on an edge of the semi-transmissive region. The fixing portion 121 prevents the display unit 170 from moving out of the designated position during use of the display device.

A height of the fixing portion 121 may be greater than or equal to a thickness of the display unit 170. The thickness of the display unit 170 may be about 0.3 mm. In this case, the height of the fixing portion 121 may be greater than or equal to 0.3 mm.

Meanwhile, at least part of one surface of the transparent substrate 120, which is in contact with the display unit 170, may be curved. In this case, the display unit 170 may be made flexible so as to be completely in contact with the curved surface area.

Meanwhile, the elastic portion 210 is located to cover the lower surface of the display unit 170. The elastic portion 210 presses the display unit 170 to prevent the display unit 170 from being spaced apart from the transparent substrate 120.

The elastic portion 210 plays a role of preventing excessive pressure from being applied to the display unit 170 by buffering pressure due to the back cover 190 when the back cover 190 is assembled. The back cover 190 may include a second fixing portion 191 protruding therefrom. The second fixing portion 191 prevents the back cover 190 from being separated from the transparent substrate 120. The second fixing portion 191 may be located to surround the fixing portion 121.

Referring to FIG. 4, an empty space may exist between the back cover 190 and the circuit board 140. Due to the empty space, the back cover 190 may not press the circuit board 140. The transparent substrate 120 may further include the fixing portion 121 surrounding the circuit board 140 so that the position of the circuit board 140 is not changed.

Meanwhile, the back cover included in the display device according to the present invention may include a first back cover injected together with the transparent substrate, and a second back cover fixed to the first back cover.

Figure 5:
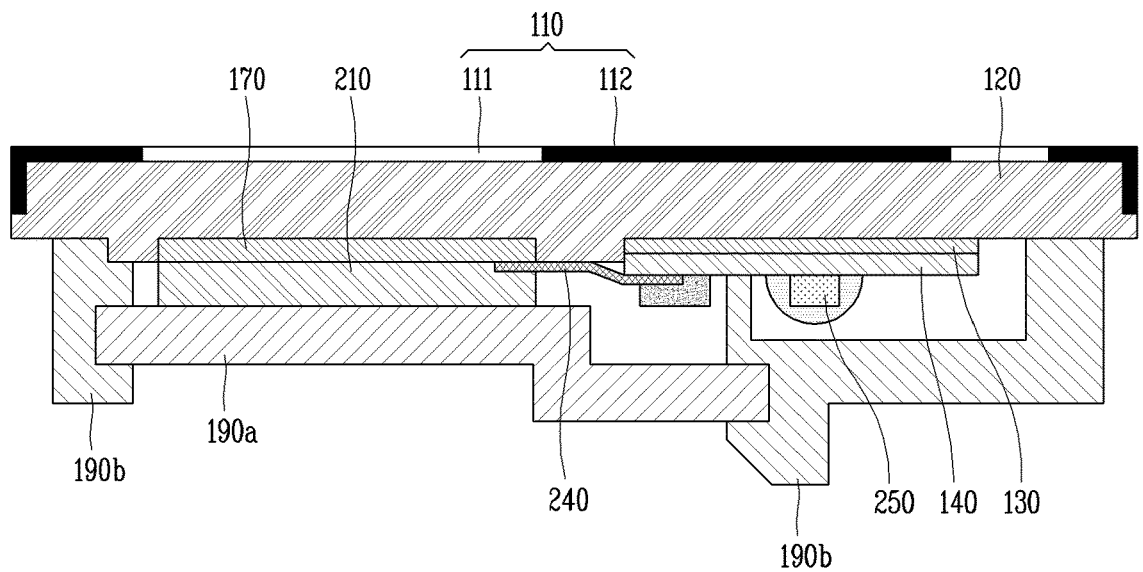
FIG. 5 is a sectional view of a display device including first and second back covers.

FIG. 5 is a sectional view of a display device including first and second back covers.

Referring to FIG. 5, a first back cover 190b may be formed together with the transparent substrate 120 in an injection manner. Specifically, the first back cover 190b may be formed only on an edge of the display device. The first back cover 190b may be formed in a remaining space except for an assembly space for the display unit 170 because the display unit 170 is in a state before being assembled when the first back cover 190b is formed in an injection molding manner.

Since the display unit 170 is in the state before being assembled when the first back cover 290b is formed, there is no possibility that the display unit 170 is broken due to the injection molding. The first back cover may be formed so as not to overlap the semi-transmissive region 111 of the filter layer 110.

The display unit 170 may be assembled into a space not covered by the first back cover. The second back cover 190a may be located to overlap the display unit 170 and may be fixed to the first back cover 190b. At least one recess may be formed in the first back cover 190b to fix the second back cover 190a. A fixing member for fixing the second back cover 190a is not particularly limited.

Meanwhile, the elastic portion 210 may be located between the second back cover 190a and the display unit 170. The second back cover 190a may be located to press the elastic portion 210. Accordingly, when the second back cover 190a is assembled, a thickness of the elastic portion 210 decreases.

As described above, the present invention prevents the display unit 170 from being changed in position or from being damaged during assembly of the back cover by virtue of the fixing portion 121 and the elastic portion 210.

Hereinafter, various types of fixing portions and elastic portions will be described.

FIGS. 6 to 9 are sectional views illustrating modified embodiments of a fixing portion and an elastic portion.

Figure 6:
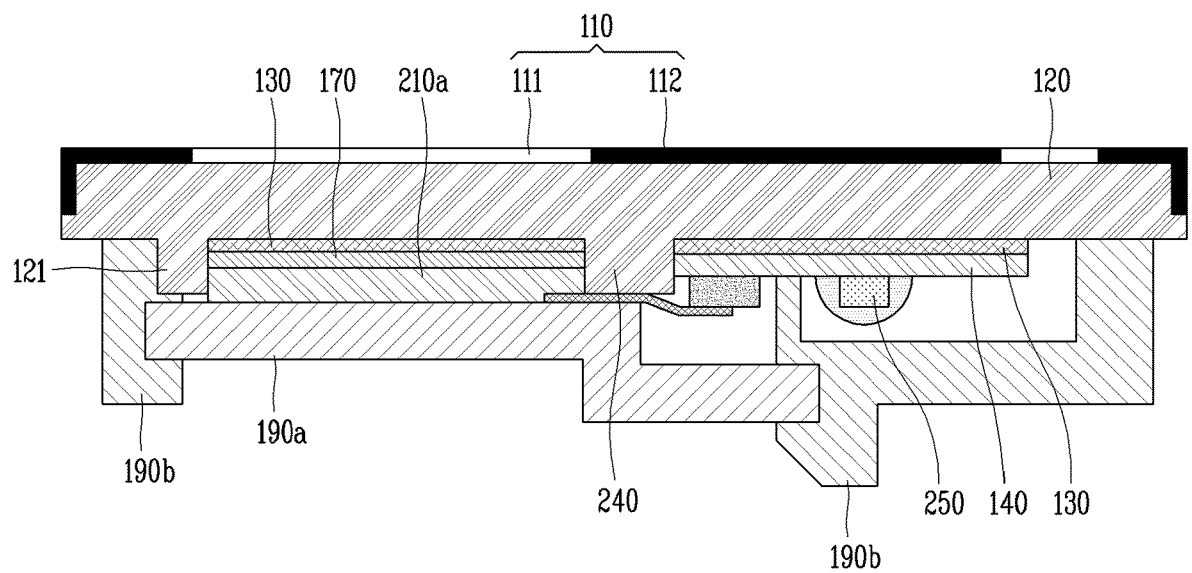
FIGS. 6 to 9 are sectional views illustrating modified embodiments of a fixing portion and an elastic portion.

Referring to FIG. 6, a height of the fixing portion 121 may be greater than or equal to a thickness of the display unit 170. Further, a part of the elastic portion 210 may be surrounded by the fixing portion 121. The elastic portion 210 may be located in a space surrounded by the fixing portion 121. Accordingly, the fixing portion 121 prevents the elastic portion 210 from being separated from a designated position.

On the other hand, as illustrated in FIG. 6, a first adhesive layer 130 may be separately located between the transparent substrate 120 and the display unit 170. The first adhesive layer 130 prevents the display unit 170 from being separated from the transparent substrate 120.

Also, the first adhesive layer 130 completely adheres the transparent substrate 120 to the display unit 170. The display unit 170 may have a touch-sensing function. Touch sensitivity of the display unit 170 may be improved by completely adhering the display unit 170 to the transparent substrate 120.

Figure 7:
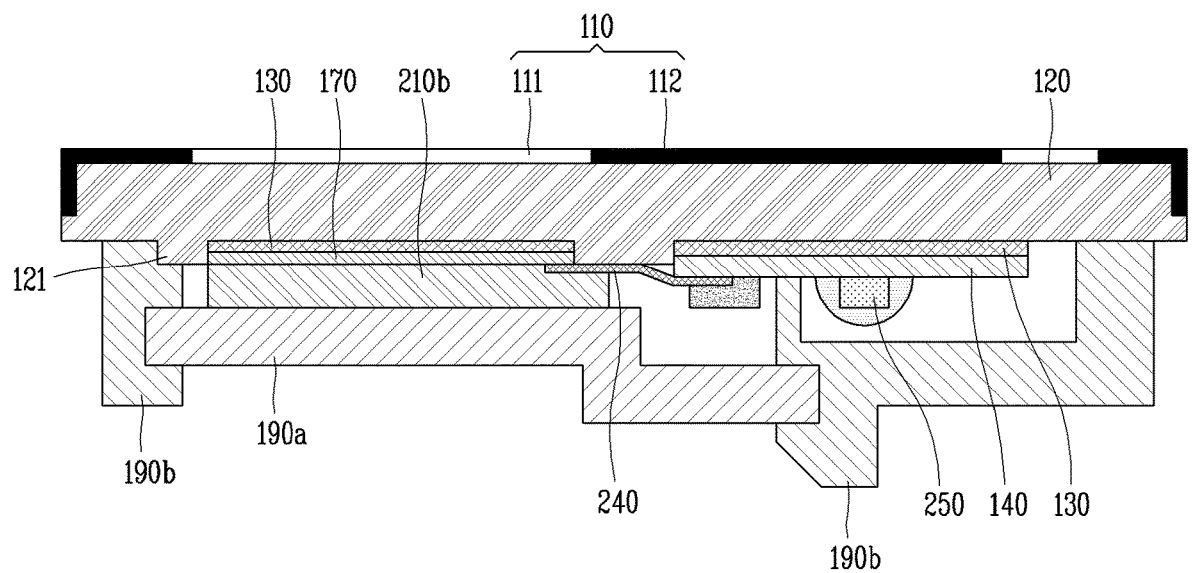

On the other hand, referring to FIG. 7, a height of the fixing portion 121 may be the same as a thickness of the display unit 170 or may be the same as the sum of the thickness of the display unit 170 and a thickness of the adhesive layer 130. In this case, there is no difference in height between the display unit 170 and the fixing portion.

Here, an elastic portion 210b may be formed to have an area larger than that of the display unit 170, and may be arranged to overlap at least part of the fixing portion 121. In this case, a part of the elastic portion 210 is located between the fixing portion 121 and the second back cover 190a. Accordingly, at least one surface of the fixing portion 121 is pressed by the elastic portion 210b.

Figure 8:
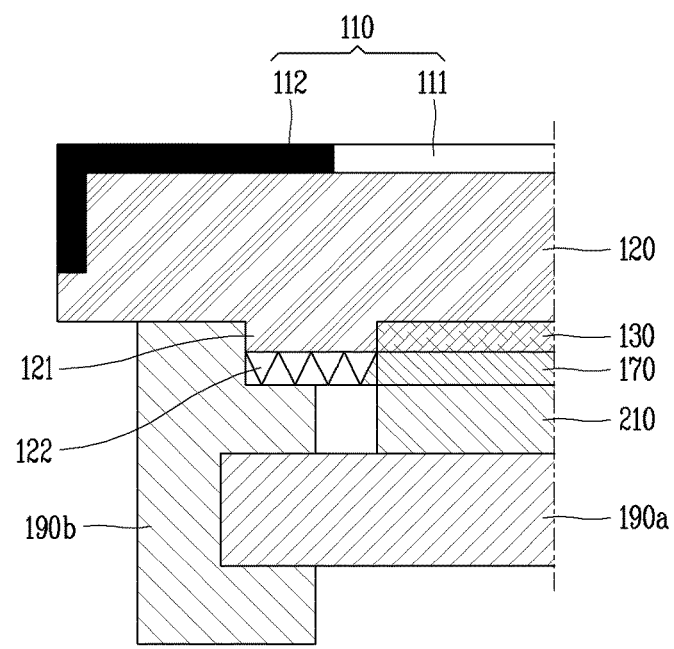

As illustrated in FIG. 8, a concave-convex structure 122 may be formed on one surface of the fixing portion 121, which is pressed by the elastic portion 210. The concave-convex structure 122 increases a frictional force between the fixing portion 121 and the elastic portion 210, so as to prevent the elastic portion 210 from being separated from a designated position.

As described above, the fixing portion 121 prevents the elastic portion 210, as well as the display unit 170, from being separated from the designated position due to external pressure.

Meanwhile, the display device according to the present invention may further include a separate structure for fixing the elastic portion.

Figure 9:
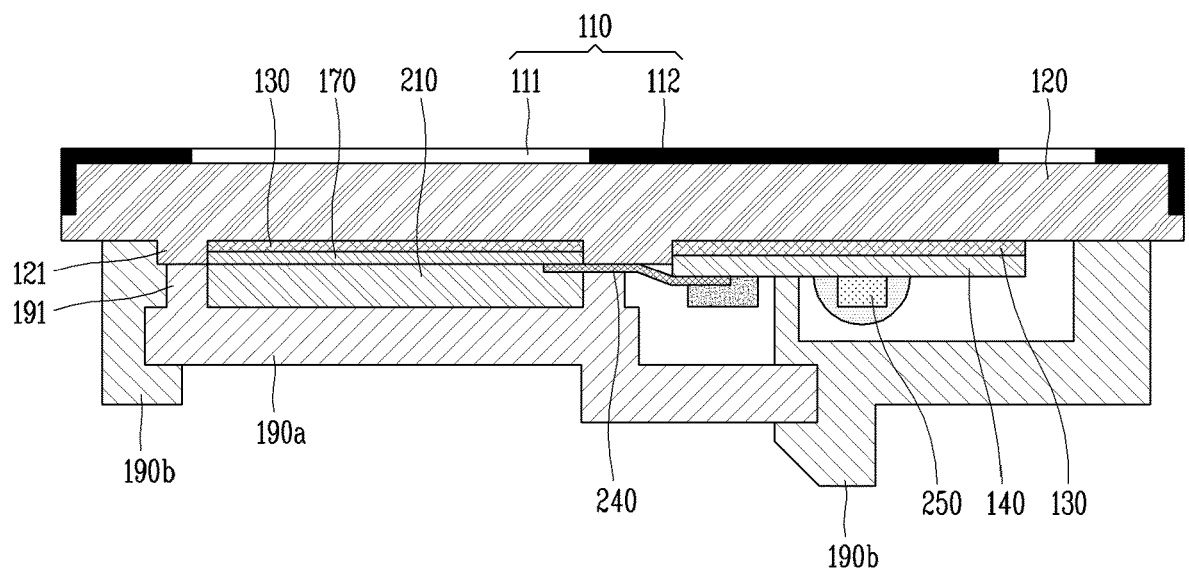

FIG. 9 is a sectional view of a display device including a second fixing portion.

As illustrated in FIG. 9, the second back cover 190a may include a second fixing portion 191 protruding to surround a side surface of the elastic portion 210. The second fixing portion 191 surrounds the elastic portion 210 so that the elastic portion 210 is fixed to a preset position.

Here, the second fixing portion 191 may be arranged to be in contact with the transparent substrate 120. In one embodiment, as illustrated in FIG. 9, the second fixing portion 191 may be arranged to be in contact with the fixing portion 121. The display unit 170 and the elastic portion 210 are located in a space surrounded by the first and second fixing portions.

The second fixing portion 191 may maintain a predetermined distance between the second back cover 190a and the transparent substrate 120 to prevent excessive pressure from being applied to the elastic portion 210. The second fixing portion 191 transfers an external impact to the transparent substrate 120 other than the display unit when the external impact is applied to the second back cover 190a, thereby preventing the display unit 170 from being damaged.

As described above, the display device according to the present invention prevents excessive pressure from being applied to the display unit and prevents the display unit from being damaged due to an external impact, by virtue of the fixing portion formed on the back cover.

Meanwhile, the display device according to the present invention includes a structure for recovering the display unit located therein.

Figure 10:
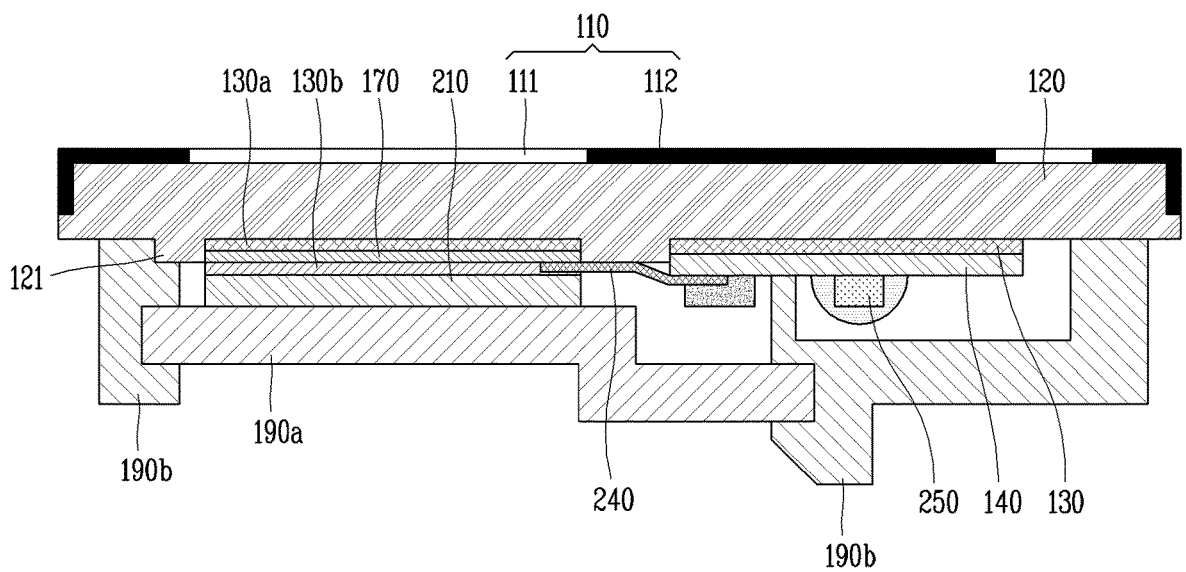
FIG. 10 is a sectional view of a display device including first and second adhesive layers.

FIG. 10 is a sectional view of a display device including first and second adhesive layers.

Referring to FIG. 10, the display device according to the present invention may further include a first adhesive layer 130a located between the transparent substrate 120 and the display unit 170 to adhere the transparent substrate 120 and the display unit 170 to each other, and a second adhesive layer 130b located between the display unit 170 and the elastic portion 210 to adhere the display unit 170 and the elastic portion 210 to each other.

The first adhesive layer 130a closely adheres the display unit 170 to the transparent substrate 120. This improves touch sensitivity of the display unit 170 but makes it difficult to recover the display unit 170 later.

In order to facilitate the recovery of the display unit 170, the present invention ensures that adhesive strength of the second adhesive layer 130b is stronger than that of the first adhesive layer 130a. Accordingly, when the elastic portion 210 is separated from the transparent substrate 120, the display unit 170 is separated together with the elastic portion 210. Thus, the present invention facilitates the recovery of the display unit 170.

On the other hand, as illustrated in FIGS. 5 to 10, the display device according to the present invention may include a circuit board 140 located on one surface of the transparent substrate 120 to apply a voltage to the display unit 170. The fixing portion 121 is located between the circuit board 140 and the display unit 170. The display device according to the present invention may further include a connection electrode 240 electrically connecting the circuit board 140 and the display unit 170 to each other. A part of the connection electrode 240 is located on the fixing portion 121.

The connection electrode 240 is formed after the display unit 170 and the circuit board 140 are located on the transparent substrate 120. Therefore, a position where the connection electrode 240 is located should be exposed to the outside until before assembling the second back cover 190a. Therefore, the first back cover 190a is not located at the position where the connection electrode 240 is formed. In addition, a region connected with the connection electrode 240 of an entire region of the circuit board is located to overlap the second back cover 190a.

It will be apparent to those skilled in the art that the present invention may be embodied in other specific forms without departing from the spirit or essential characteristics thereof.

Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. A display device, comprising:
   a display unit including a plurality of semiconductor light emitting devices and outputting light to an upper surface thereof;
   a transparent substrate located on an upper side of the display unit and including a fixing portion protruding from one surface thereof to surround a side surface of the display unit;
   an elastic portion located to cover a lower surface of the display unit and made of an elastic member;
   a first back cover coupled to a part of the transparent substrate not overlapping the display unit in an injection manner; and
   a second back cover located to overlap the display unit and fixed to the first back cover,
   wherein the elastic portion is configured to press the display unit toward the transparent substrate.

2. The device of claim 1, further comprising a filter layer located on another surface of the transparent substrate and including a semi-transmissive region for transmitting a part of incident light therethrough, and a non-transmissive region made of an opaque material,
   wherein the display unit is located to overlap the semi-transmissive region of the filter layer.

3. The device of claim 2, wherein the fixing portion is located on an edge of the semi-transmissive region so that the display unit overlaps the semi-transmissive region.

4. The device of claim 3, wherein the second back cover is located to press the elastic portion.

5. The device of claim 4, wherein a height of the fixing portion is greater than a thickness of the display unit.

6. The device of claim 5, wherein a part of the elastic portion is surrounded by the fixing portion.

7. The device of claim 3, wherein a part of the elastic portion is located between the fixing portion and the second back cover, and wherein a part of the elastic portion is configured to press the fixing portion.

8. The device of claim 7, wherein the fixing portion includes a concave-convex structure located on one surface thereof pressed by the elastic portion.

9. The device of claim 1, wherein the second back cover includes a second fixing portion protruding to surround a side surface of the elastic portion.

10. The device of claim 9, wherein the second fixing portion is located to be in contact with the transparent substrate.

11. The device of claim 1, further comprising a circuit board located on one surface of the transparent substrate to apply a voltage to the display unit; and a connection electrode electrically connecting the circuit board and the display unit to each other, wherein a part of the connection electrode is located on the fixing portion.

12. The device of claim 11, wherein the first back cover is coupled to another region, except for a region connected to the connection electrode, of an entire region of the circuit board, in an injection manner.

13. The device of claim 12, wherein the second back cover is located to overlap the region connected to the connection electrode of the entire region of the circuit board.

14. The device of claim 1, further comprising a first adhesive layer located between the transparent substrate and the display unit to adhere the transparent substrate and the display unit to each other.

15. The device of claim 14, further comprising a second adhesive layer located between the display unit and the elastic portion to adhere the display unit and the elastic portion to each other, wherein the second adhesive layer includes adhesive strength stronger than that of the first adhesive layer.

\* \* \* \* \*